United States Patent
Miyata

(10) Patent No.: US 6,886,923 B2
(45) Date of Patent: May 3, 2005

(54) SMALL-SIZED LIQUID-JET HEAD AND LIQUID-JET APPARATUS WITH INCREASED NUMBER OF ARRAYS OF NOZZLE ORIFICES

(75) Inventor: Yoshinao Miyata, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/464,810

(22) Filed: Jun. 19, 2003

(65) Prior Publication Data

US 2004/0001122 A1 Jan. 1, 2004

(30) Foreign Application Priority Data

Jun. 19, 2002 (JP) ........................................ 2002-179228
Jun. 28, 2002 (JP) ........................................ 2002-190022

(51) Int. Cl.[7] .............................................. B41J 2/045
(52) U.S. Cl. ....................................................... 347/71
(58) Field of Search .............................. 347/68–72, 20, 347/50; 327/407

(56) References Cited

U.S. PATENT DOCUMENTS 5,894,242 A * 4/1999 Fujimoto .................... 327/407
6,331,052 B1 * 12/2001 Murai et al. ................. 347/68
6,497,477 B1 * 12/2002 Nakamura et al. ........... 347/70

FOREIGN PATENT DOCUMENTS

| EP | 0 931 650 A1 | 7/1999 | |
| EP | 1 080 895 A1 | 3/2001 | |
| EP | 1 086 814 A2 | 3/2001 | |
| JP | 5-286131 A | 11/1993 | |
| JP | 7-144406 A | 6/1995 | |
| JP | 8-187860 A | 7/1996 | |
| JP | 10100401 A | * 4/1998 | ............ B41J/2/045 |
| JP | 2000351208 A | 12/2000 | |

* cited by examiner

*Primary Examiner*—Hai Pham
(74) *Attorney, Agent, or Firm*—Sughrue Mion, PLLC

(57) ABSTRACT

Disclosed is a liquid-jet head and a Liquid-jet apparatus, which are capable of reliably supplying a driving voltage to a driving IC, increasing the number of arrays of nozzle orifices, and being made small-sized. The liquid-jet head comprises a passage-forming substrate in which a pressure generating chamber communicating with an nozzle orifice is defined, and piezoelectric elements; each piezoelectric element being provided in the passage-forming substrate via a vibration plate, wherein a joint plate, on which a driving IC and a wiring pattern are provided, to an upper portion of which is connected an external wiring, is joined to the piezoelectric element side of the passage-forming substrate, a plurality of driving voltage supply pads, to which a driving voltage to be distributed to each piezoelectric element is supplied, are provided on the driving IC along a long direction of the driving IC, the adjacent driving voltage supply pads being electrically connected by a connection wiring formed of a conductive wire, and the driving voltage supply pad in an end portion of the driving IC in the long direction thereof and the wiring pattern being electrically connected by the connection wiring.

14 Claims, 8 Drawing Sheets

SMALL-SIZED LIQUID-JET HEAD AND LIQUID-JET APPARATUS WITH INCREASED NUMBER OF ARRAYS OF NOZZLE ORIFICES

BACKGROUND OF THE INVENTION

1. Field of the Invention

The present invention relates to a liquid-jet head in which a part of a pressure generating chamber, which communicates with a nozzle orifice for ejecting liquid droplets, is constituted by a vibration plate, a piezoelectric element formed on a surface of the vibration plate, and the liquid droplets ejected by a displacement of the piezoelectric element. The present invention also relates to a Liquid-jet apparatus.

2. Related Background of the Invention

As a Liquid-jet apparatus, for example, there has been an ink jet recording apparatus which applies ejection energy to ink in a pressure generating chamber communicating with a nozzle corresponding to a printing signal and ejects ink droplets from a nozzle orifice. An ink jet recording head installed in this ink jet recording apparatus is roughly divided into two types. One is an ink jet recording head in which a heat generating element such as a resistance wire that generates Joule heat by a driving signal is provided in a pressure generating chamber, and ink droplets are ejected from a nozzle orifice by bubbles generated by the heat generating element. The other is a piezoelectric vibration type ink jet recording head in which a part of a pressure generating chamber is constituted by a vibration plate, and ink droplets are ejected from a nozzle orifice by deforming the vibration plate by use of a piezoelectric element.

For the piezoelectric vibration type ink jet recording head, two types have been put into practical use. One is an ink jet recording head which uses a piezoelectric actuator in a long vibration mode, which stretches and contracts a piezoelectric element in its axis direction, and the other is an ink jet recording head which uses a piezoelectric actuator in a flexible vibration mode.

The former is capable of varying a volume of the pressure generating chamber by allowing an end plane of the piezoelectric element to contact the vibration plate and of being manufactured so as to be suitable for high density printing. However, a difficult process, in which the piezoelectric element is split into pieces in a comb teeth shape to make them coincide with an array pitch of the nozzle orifices, and the operation of positioning and fixing the split piezoelectric element onto the pressure generating chamber are required, thus there is a problem of a complicated manufacturing process.

On the other hand, in the latter ink jet recording head, the piezoelectric element can be fabricated and installed on the vibration plate by a relatively simple process, in which a green sheet as a piezoelectric material is adhered while fitting a shape thereof to the shape of the pressure generating chamber and is sintered. However, a certain size of the vibration plate is required due to the use of flexible vibrations, thus there is a problem that a high density array of the piezoelectric elements is difficult.

Meanwhile, in order to solve such a disadvantage of the latter recording head, as disclosed in Japanese Patent Laid-Open Publication No. Hei 5(1993)-286131, a recording head is proposed, in which an even piezoelectric material layer is formed over the entire surface of the vibration plate by a film deposition technology, the piezoelectric material layer is split into a shape corresponding to the pressure generating chamber by a lithography method, and the piezoelectric element is formed so as to be independent for each pressure generating chamber. According to this gazette, the operation of adhering the piezoelectric element onto the vibration plate is not required, and thus there is an advantage that not only the piezoelectric element can be fabricated and installed by accurate and simple technique called a lithography method, but also the thickness of the piezoelectric element can be thinned and a high-speed drive thereof is enabled.

Although it is possible to improve printing quality and printing speed by using the piezoelectric element formed by such a thin film, a further increase in the printing quality and the printing speed has been recently desired.

Such a piezoelectric element is generally driven by a driving IC, and this driving IC is installed on an ink jet recording head. For example, a joint plate where a piezoelectric element holding portion for defining a space having a size which does not disturb a movement of the piezoelectric element is provided is joined to a plane of a passage-forming substrate on the piezoelectric element side, where the pressure generating chamber is formed. A wiring pattern to which an external wiring such as FPC is connected is provided on an upper portion of the joint plate, and the driving IC is fixed thereto.

In the above-described conventional ink jet recording head, since the driving IC and the wiring pattern on the joint plate are electrically connected via a bonding wire in a plurality of spots on one side of the driving IC in a short direction thereof, there is a problem that a comparatively wide space for connecting the boding wire to the joint plate is required and the head becomes large-sized.

On the other hand, although it is possible to meet a demand for improvements of the printing quality and the printing speed by increasing the number of arrays of the nozzle orifices, there is a problem that the driving IC for driving the piezoelectric element must be made large-sized with the increase of the number of the arrays of the nozzle orifices. There is also a problem that when the driving IC is formed to be relatively large-sized, cost significantly increases. Furthermore, when it is intended to make the driving IC large-sized, a voltage drop and the like may occur, and a relatively large wiring area must be secured to prevent the occurrence of the voltage drop and the like. Accordingly, there is a problem that the driving IC is made larger-sized than necessary. Furthermore, it is difficult to form the driving IC so as to have a longer dimension than a certain length, and it may be impossible to cope with the increase of the number of the arrays of the nozzles.

Such problems exist not only in the ink jet recording head which ejects ink but also in other liquid-jet heads which eject liquid other than the ink.

SUMMARY OF THE INVENTION

In view of such circumstances, an object of the present invention is to provide a liquid-jet head and a Liquid-jet apparatus, which are capable of reliably supplying a driving voltage to a driving IC, increasing the number of arrays of nozzle orifices, and being made small-sized.

A first aspect of the present invention to attain the above object is a liquid-jet head which includes a passage-forming substrate in which pressure generating chambers communicating with nozzle orifices are defined, and piezoelectric elements; each piezoelectric element being provided in the passage-forming substrate via a vibration plate, wherein a joint plate, on which driving ICs and a wiring pattern are provided, to an upper portion of which is connected an external wiring, is joined to the piezoelectric element side of the passage-forming substrate; a plurality of driving voltage supply pads, to which a driving voltage to be distributed to each piezoelectric element is supplied, are provided on the driving IC along a long direction of the driving IC, the adjacent driving voltage supply pads being electrically connected by a connection wiring formed of a conductive wire, and the driving voltage supply pad in an end portion of the driving IC in the long direction thereof and the wiring pattern being electrically connected by the connection wiring.

In the first aspect of the present invention, the driving voltage supply pads are connected by the connection wiring, and the wiring pattern and the driving voltage supply pad in the end portion of the driving IC in the long direction thereof are connected by the connection wiring. Accordingly, it is unnecessary to secure a space for connecting the wiring pattern and the connection wiring outside the driving IC in its short direction, and thus the head can be made small-sized.

In the first aspect, a second aspect of the present invention is the liquid-jet head, in which the wiring pattern is formed on outside of the both end portions of the driving IC in the long direction thereof, the driving voltage supply pads on both ends provided in parallel and the wiring pattern is electrically connected via the connection wiring, and the external wiring is connected to the wiring pattern in the vicinity of the end portion of the driving IC on the joint plate in the long direction of the driving IC.

In the second aspect of the present invention, the wiring pattern and the driving voltage supply pads in both ends of the driving IC in the long direction thereof are connected, and hence a distance between the driving voltage supply pads and the wiring pattern is made short. Thus, a voltage drop can be controlled. Accordingly, the equal level of driving voltage is supplied to each of the driving voltage supply pads.

In the first or second aspect of the present invention, a third aspect of the present invention is the liquid-jet head, in which the number j of the connection wirings connected to the driving voltage supply pad satisfies the following equation (1):

$$ncV/t < ij \qquad (1)$$

where c is electrostatic capacitance of one piezoelectric element, n is the number of the piezoelectric elements driven by one driving IC, V is the maximum voltage of the driving voltage, t is the minimum time constant of the driving voltage, and i is a fusing current of one connection wiring.

In the third aspect of the present invention, by using the connection wirings of the number satisfying the equation (1), the connection wirings do not blow out even if all of the piezoelectric elements are driven, and the driving voltage is supplied to the driving voltage supply pad satisfactorily.

In any one of the first to third aspects of the present invention, a fourth aspect of the present invention is the liquid-jet head, in which a plurality of signal input pads, to which a driving signal for driving the driving IC is inputted, are provided in the end portion of the driving IC in the long direction thereof.

In the fourth aspect of the present invention, by providing the signal input pads in the end portion of the driving IC in the long direction thereof, the signal input pads and the wiring pattern can be connected by a wiring extensively provided along the long direction of the driving IC. Accordingly, it is unnecessary to secure a space for connecting the wiring pattern and the connection wiring outside the driving IC in the short direction thereof, and thus the head can be made small-sized.

In any one of the first to fourth aspects of the present invention, a fifth aspect of the present invention is the liquid-jet head, in which the pressure generating chambers defined by a plurality of compartment walls are provided in two lines, and the two driving ICs are provided so as to correspond to the lines of the pressure generating chambers.

In the fifth aspect of the present invention, it is unnecessary to secure a space for connecting the wiring pattern and the connection wiring outside each of the two driving ICs in the short direction thereof, and the head can be made further small-sized.

A sixth aspect of the present invention is a liquid-jet head which includes a passage-forming substrate in which pressure generating chambers communicating with nozzle orifices are defined, and piezoelectric elements including a lower electrode, a piezoelectric layer and an upper electrode, which are provided in the passage-forming substrate via a vibration plate, wherein a joint plate connected to the piezoelectric element side of the passage-forming substrate is provided; a wiring pattern, to which an external wiring is connected, is provided on the joint plate; at least two driving ICs for driving the piezoelectric element are loaded on the joint plate at predetermined intervals in a direction where the pressure generating chambers are provided in parallel; a driving voltage supply pad, to which a driving voltage to be distributed to the piezoelectric elements are supplied, is provided on each of the driving ICs; a signal input pad connected to a connection wiring extensively provided from the wiring pattern is provided in the driving IC; a signal output pad, from which part of the driving signal inputted thereto is outputted, is provided in the driving IC; and the signal output pad of one driving IC adjacent to the other driving IC and the signal input pad of the other driving IC are connected by a coupling wiring.

In the sixth aspect of the present invention, by providing a plurality of the driving ICs in parallel, the liquid-jet head in which the number of arrays of the nozzle orifices is increased can be realized relatively easily. Moreover, a space for forming a wiring to supply a driving signal to be supplied to the driving IC can be controlled to be small. Therefore, it is possible to achieve the small size of the head.

In the sixth aspect of the present invention, a seventh aspect of the present invention is the liquid-jet head, in which the driving ICs are provided in parallel at predetermined intervals along the long direction thereof, the signal input pads are arranged in the vicinity of one end portion of the driving IC in the long direction thereof, and the signal output pads are arranged in the vicinity of the other end portion of the driving IC in the long direction thereof.

In the seventh aspect of the present invention, since the driving IC and the connection pattern are connected on the end portion side of the driving IC in the long direction thereof, the width of the head can be reduced.

In the seventh aspect of the present invention, an eighth aspect of the present invention is the liquid-jet head, in which signal input pads corresponding to at least a part of driving signals except a signal outputted via the signal output pads are further provided in the vicinity of the other end portion of the driving IC in the long direction thereof.

In the eighth aspect of the present invention, since, for example, the predetermined driving signal such as a power source signal for driving the driving IC can be inputted from both sides of the driving IC in the long direction thereof, occurrence of a voltage drop and the like can be prevented. Accordingly, ink droplets can be ejected satisfactorily.

In any one of the sixth to eighth aspects of the present invention, a ninth aspect of the present invention is the liquid-jet head, in which the connection wirings are connected to the wiring pattern inside a width of the driving IC.

In the ninth aspect of the present invention, it is unnecessary to secure a space for connecting the wiring pattern and the connection wiring outside the driving ICs in the width direction thereof, and thus the size of the head, especially the width thereof can be reduced.

In any one of the sixth to ninth aspects of the present invention, a tenth aspect of the present invention is the liquid-jet head, in which the driving IC is a serial parallel conversion type driver IC, and the driving signal outputted via the signal output pad includes at least a clock signal and a latch signal.

In the tenth aspect of the present invention, occurrence of a voltage drop and the like is prevented, and the small size of the head can be achieved.

In any one of the sixth to tenth aspects of the present invention, an eleventh aspect of the present invention is the liquid-jet head, in which the driving signal inputted from the signal input pad via the connection wiring includes at least a ground signal and a power source signal for driving.

In the eleventh aspect of the present invention, the voltage drop and the like do not occur, and the small size of the head can be achieved.

In any one of the first to eleventh aspects of the present invention, a twelfth aspect of the present invention is the liquid-jet head, in which the pressure generating chambers are formed by anisotropically etching a single crystal silicon substrate, and each layer of the piezoelectric element is formed by a film formation method and a lithography method.

In the twelfth aspect of the present invention, the liquid-jet head having high-density nozzle orifices can be relatively easily manufactured in large quantities.

A thirteenth aspect of the present invention is a Liquid-jet apparatus which includes the liquid-jet head in any one of the first to twelfth aspects of the present invention.

In the thirteenth aspect of the present invention, printing quality can be improved, and the small-sized Liquid-jet apparatus can be achieved.

BRIEF DESCRIPTION OF THE DRAWINGS

FIG. 3(a) is the section view in a long direction of a pressure generating chamber, and FIG. 3(b) is the section view taken along the line A–A' of FIG. 3(a).

DESCRIPTION OF THE PREFERRED EMBODIMENTS

The present invention will be described in detail based on each embodiment below.

Embodiment 1

Figure 1:
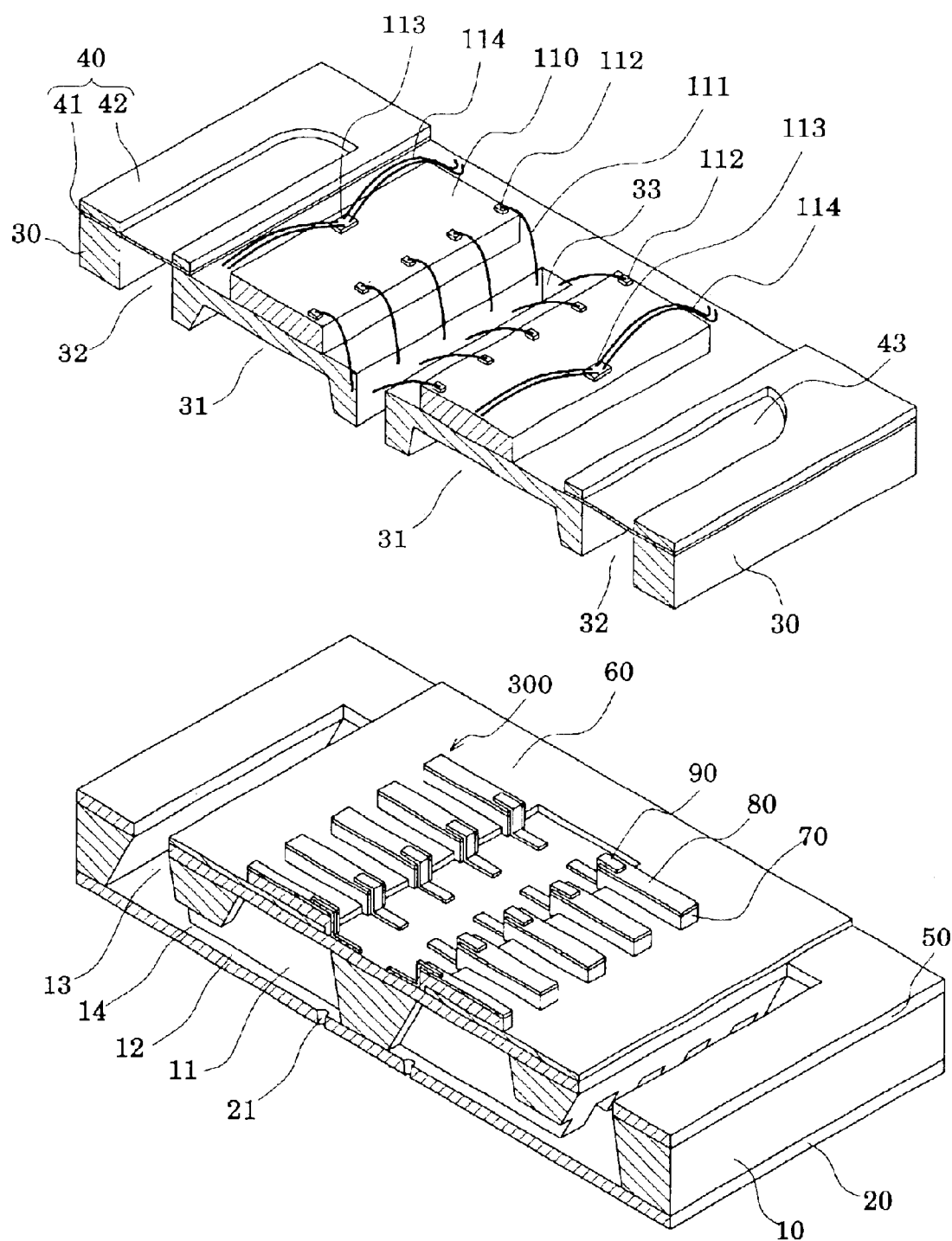
FIG. 1 is an exploded perspective view of a recording head according to Embodiment 1.
Figure 2:
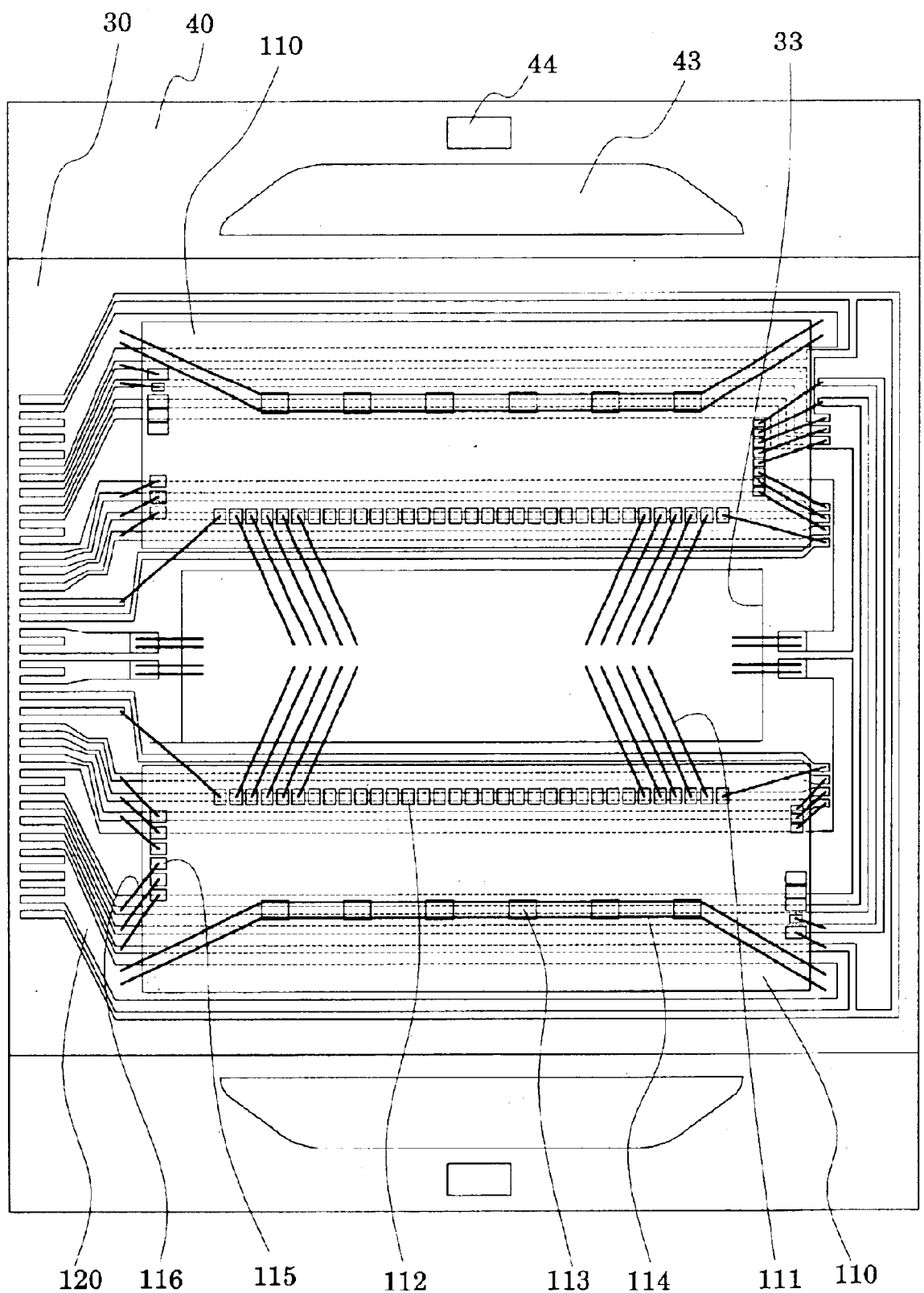
FIG. 2 is a schematic plan view of the recording head according to Embodiment 1.
Figure 3A:
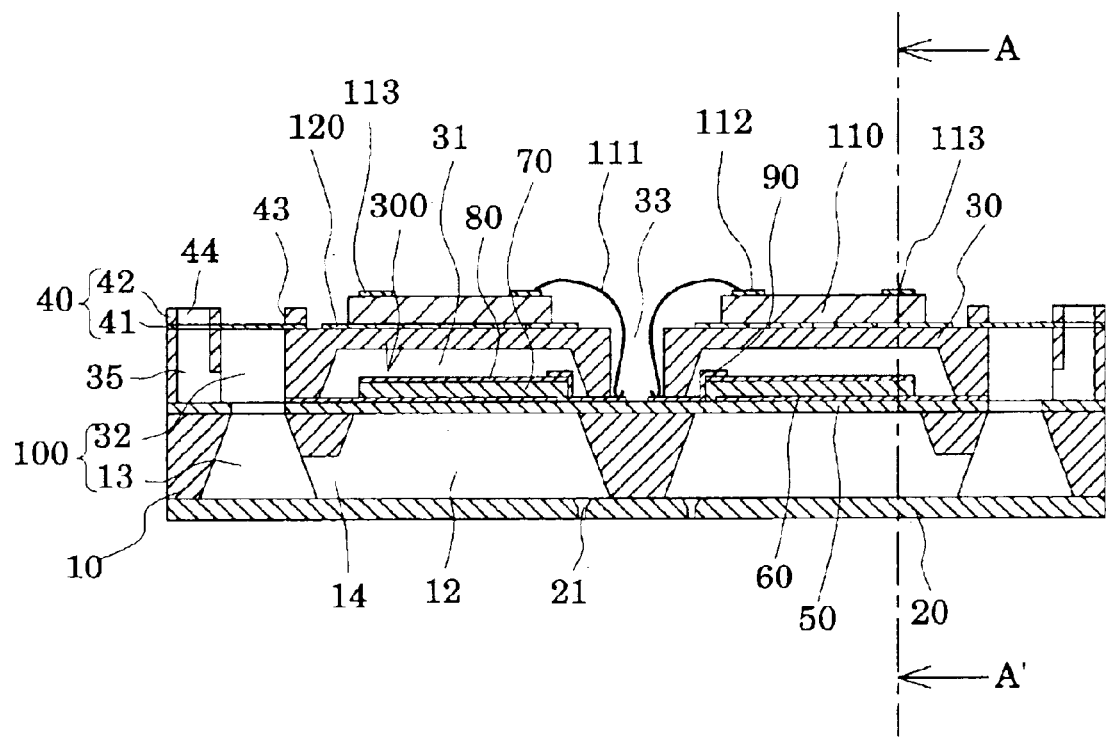
FIGS. 3(a) and 3(b) are section views of the recording head according to Embodiment 1.
Figure 3B:
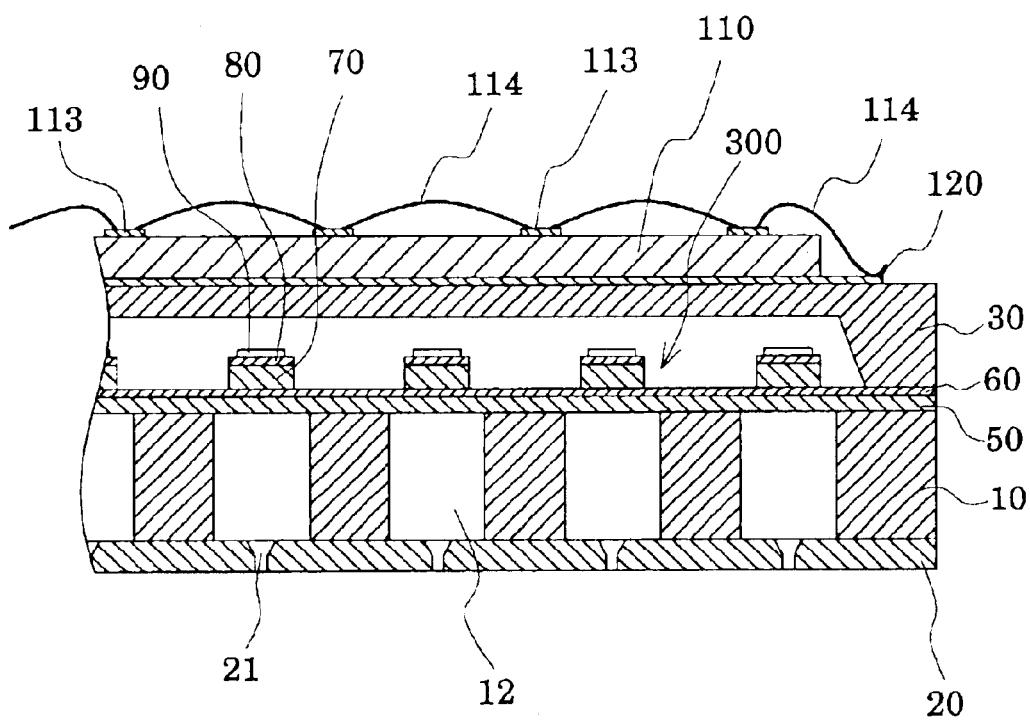

FIG. 1 is an exploded perspective view of an ink jet recording head according to Embodiment 1. FIG. 2 is a schematic plan view of FIG. 1. FIGS. 3(a) and 3(b) are section views of the ink jet recording head. FIG. 3(a) is a section view of a pressure generating chamber, and FIG. 3(b) is a section view taken along the line A–A' of FIG. 3(a).

As illustrated in the drawings, in this embodiment, a passage-forming substrate 10 is formed of a single crystal silicon substrate of a plane orientation (110), and an elastic film 50 having a thickness of about 1 to 2 $\mu$m, which is made of silicon dioxide previously formed by thermal oxidation, is formed on one side of the passage-forming substrate 10.

In this passage-forming substrate 10, pressure generating chambers 12 comparted by a plurality of compartment walls are provided in two lines in its width direction, by anisotropically etching the substrate 10 from the other side thereof. A communicating portion 13 constituting a part of a reservoir 100 serving as a common ink chamber of each pressure generating chamber 12 is formed outside each pressure generating chamber 12 in its long direction, and communicates with one end of each pressure generating chamber 12 in its long direction through an ink supply path 14.

Herein, the anisotropic etching is performed by use of difference of an etching rate in the single crystal silicon substrate. For example, in this embodiment, the anisotropic etching is performed by use of the following nature of the single crystal silicon substrate. Specifically, when the single crystal silicon substrate is dipped in an alkaline solution such as KOH solution, the single crystal silicon substrate is gradually eroded, and a first (111) plane perpendicular to the (110) plane and a second (111) plane which makes an angle of about 70 degrees relative to the first (111) plane and an angle of about 35 degrees relative to the (110) plane emerges. The etching rate of the (111) plane is slower than that of the (110) plane by about $\frac{1}{180}$. By such anisotropic etching, it is possible to perform a precise processing based on a depth processing for forming each parallelogrammatic pressure generating chamber 12 formed by the two first (111) planes and the two slanted second (111) planes. Thus, the pressure generating chambers 12 can be arrayed with a high density.

In this embodiment, a longer side of each pressure generating chamber 12 is formed by the first (111) plane and a shorter side thereof is formed by the second (111) plane. The pressure generating chamber 12 is formed by etching the passage-forming substrate 10 until an etching depth reaches almost to the elastic film 50. Herein, the elastic film 50 shows an extremely small quantity of erosion by the alkaline solution which etches the single crystal silicon substrate. The supply path 14 communicating with one end of each pressure generating chamber 12 is formed to be shallower than the pressure generating chamber 12, and maintains a flow passage resistance to ink flowing into the pressure generating chamber 12 to be constant. Specifically, the ink supply path 14 is formed by etching (half-etching) the single crystal silicon substrate partway in its thickness direction. Note that the half-etching is performed by regulating an etching time.

The most suitable thickness of the passage-forming substrate 10 may be selected in accordance with an array density of the pressure generating chambers 12. If the array density of the pressure generating chambers 12 is, for example, about 180 (180 dpi) per one inch, the thickness of the passage-forming substrate 10 may be about 220 μm. When the pressure generating chambers 12 are arrayed at relatively high density, for example, at the density of 200 dpi or more, it is preferable that the thickness of the passage-forming substrate 10 is made to be as relatively thin as 100 μm or less. This is because the array density of the pressure generating chambers 12 can be made high while maintaining rigidity of the compartment wall between the adjacent pressure generating chambers 12.

A nozzle plate 20, in which a nozzle orifice 21 communicating with each pressure generating chamber 12 on the opposite side of the ink supply path 14 is pierced, is fixed to the opening plane side of the passage-forming substrate 10 through an adhesive agent, a heat melting film or the like. The nozzle plate 20 is made of glass ceramics or stainless steel, which has a thickness of, for example, 0.1 to 1 mm, and a linear expansion coefficient of, for example, 2.5 to 4.5 [×10−8/° C.] at 300° C. or less. The nozzle plate 20 covers one entire plane of passage-forming substrate 10 with its one plane, and also serves as a reinforcement plate for protecting the passage-forming plate 10, which is the single crystal silicon substrate, from a shock and external force. Moreover, the nozzle plate 20 may be made of a material having approximately the same thermal expansion coefficient as that of the passage-forming substrate 10. In this case, since deformations of the passage-forming substrate 10 and the nozzle plate 20 are approximately equal to each other, the passage-forming substrate 10 and the nozzle plate 20 can be joined to each other easily by use of a thermosetting adhesive agent.

Herein, the size of the pressure generating chamber 12 for applying ink droplet ejection pressure to ink and the size of the nozzle orifice 21 for ejecting ink droplets are optimized depending on a quantity of the ejected ink droplets, an ejection speed and an ejection frequency. For example, when the ink droplets of, for example, 360 pieces per one inch are recorded, it is necessary to form the nozzle orifice so as to precisely have a diameter of several tens μm.

Meanwhile, on the elastic film 50 positioned on the opposite side to the opening plane of the passage-forming substrate 10, a lower electrode film 60 having a thickness of, for example, about 0.2 μm, a piezoelectric layer 70 having a thickness of, for example, about 0.5 to 5 μm and an upper electrode film 80 having a thickness of, for example, about 0.1 μm are laminated in a process to be described later, and thus a piezoelectric element 300 is constituted. Herein, the piezoelectric element 300 means a portion including the lower electrode film 60, the piezoelectric layer 70 and the upper electrode film 80. In general, any one of the electrodes of the piezoelectric element 300 is a common electrode, and the other electrode and the piezoelectric layer 70 are patterned for each pressure generating chamber 12, thus constituting the piezoelectric element 300. Herein, a portion, which is constituted by one of the electrodes and the piezoelectric layer 70 which are patterned, and causes piezoelectric deformation by application of a voltage to both the electrodes, is called a piezoelectric active portion. In this embodiment, the lower electrode film 60 is used as the common electrode of the piezoelectric element 300 and the upper electrode film 80 is used as a discrete electrode thereof. However, for the convenience of wiring and a driving circuit, the lower and upper electrode films 60 and 80 may be used in the other way around without any trouble. In any case, the piezoelectric active portion is formed for each pressure generating chamber 12. Furthermore, in the embodiment, the piezoelectric element 300 and a vibration plate making a displacement owing to a drive of the piezoelectric element 300 is collectively referred to as a piezoelectric actuator. In the foregoing embodiment, the elastic film 50 and the lower electrode film 60 acts as the vibration plate.

To each upper electrode film 80 that is the discrete electrode of the piezoelectric element 300, a lead electrode 90 made of, for example, Au, which is led from the vicinity of the end portion of the upper electrode film 80 on the opposite side to the ink supply path 14 of the pressure generating chamber 12 and extended onto the elastic film 50 positioned at the region facing a portion between the lines of the pressure generating chambers 12, is connected.

On the passage-forming substrate 10 on which the piezoelectric element 300 is formed, that is, on the lower electrode film 60, the elastic film 50 and the lead electrode 90, a sealing plate 30 having a piezoelectric holding portion 31 sealing spaces in a state where the spaces are maintained sufficient so as not to hinder the movements of the piezoelectric elements 300. Moreover, in the sealing plate 30, a reservoir portion 32 constituting at least a part of the reservoir 100 is provided. In this embodiment, the reservoir portion 32 penetrates through the sealing plate 30 in its thickness direction, and is formed along the width direction of the pressure generating chamber 12. As described above, the reservoir portion 32 communicates with the communicating portion 13 of the passage-forming substrate 10, thus constituting the reservoir 100 serving as a common ink chamber of each pressure generating chamber 12.

For the sealing plate 30, it is preferable to employ a material, for example, glass, ceramics or the like, which has approximately the same thermal expansion coefficient as that of the passage-forming substrate 10. In this embodiment, the sealing plate 30 is formed by use of a single crystal silicon substrate which is the same material as the passage-forming substrate 10.

A penetrated hole 33 penetrating through the sealing plate 30 in its thickness direction is provided at approximately the center portion of the sealing plate 30, that is, at the region facing the portion between the lines of the pressure generating chambers 12. The vicinity of the end portion of the lead electrode 90 led from each piezoelectric element 300 is exposed to the penetrated hole 33, and connected to a driving IC 110 (to be described later) by an output connection wiring 111 formed of a bonding wire.

The two driving ICs 110 for selectively driving each of the piezoelectric elements 300 in the respective lines are fixed to the region on the sealing plate 30 corresponding to each of the lines of the pressure generating chambers 12 through a wiring pattern 120. The wiring pattern 120 at the region corresponding to the line of the pressure generating chambers 12 is continuously formed so that the wiring pattern 120 is connected to an external wiring (not shown) such as FPC at the region outside one end portion of the driving IC 110 in its long direction, and keeps conduction at the region outside the other end portion of the driving IC in its long direction. A driving signal and a driving voltage, which are supplied from the external wiring, are inputted to each driving IC 110 via this wiring pattern 120. Note that the wiring pattern 120 can be easily formed in such a manner that a conductive film such as a metal film is formed on the entire surface of the sealing plate 30 and then this film is patterned.

A plurality of output pads 112 for outputting a driving voltage having a predetermined wave form, which drives each of the piezoelectric elements 300, are provided in the vicinity of one end portion of the driving IC 110 in its short direction, that is, in the vicinity of an end portion on the penetrated hole 33 side of the sealing plate 30, along the long direction of the driving IC 110. These output pads 112 are electrically connected to the lead electrode 90, which is extensively provided from the upper electrode film 80 of each piezoelectric element 300 to be exposed to the penetrated hole 33, by the output connection wiring 111 formed of a conductive wire such as a bonding wire.

Moreover, on the driving IC 110, a plurality of driving voltage supply pads 113, to which driving voltages supplied from the external wiring via the wiring pattern 120 and having a predetermined wave form for driving the respective piezoelectric elements 300 are simultaneously inputted, are provided on the other end side in the short direction of the driving IC 110, along the long direction of the driving IC 110. One driving voltage supply pad 113 is provided so as to correspond to the output pads 112 of the predetermined number. For example, in this embodiment, one driving voltage supply pad 113 is provided for twelve output pads 112.

The adjacent driving voltage supply pads 113 are electrically connected to each other via a connection wiring 114 formed of at least one conductive wire, for example, a bonding wire. Moreover, the driving voltage supply pads 113 on both ends, which are provided in parallel, are electrically connected to the wiring pattern 120 provided below the driving IC 110 along the long direction of the driving IC 110, by at least one connection wiring 114 provided along the long direction of the driving IC 110. In the other words, the driving voltages inputted from the external wiring are inputted from the driving voltage supply pads 113 on both ends provided in parallel on the driving IC 110 to all of the driving voltage supply pads 113 via the wiring pattern 120 which is provided extensively along the long direction of the driving IC 110.

By inputting the driving voltages to all of the driving voltage supply pads 113 from the driving voltage supply pads 113 on both ends, which are provided in parallel, a wiring distance from the wiring pattern 120 to each driving voltage supply pad 113 can be shortened, and a drop of the driving voltage can be controlled. Accordingly, the equal level driving voltage can be inputted to each of the driving voltage supply pads 113.

As shown in FIG. 2, a plurality of signal input pads 115 are provided in the vicinity of both end portions of the upper plane of the driving IC 110 in its long direction. At the region on both end portion sides in the long direction of the driving IC 110, each signal input pad 115 is electrically connected to the wiring pattern 120 provided along the long direction of the driving IC 110 by the input connection wiring 116 formed of a conductive wire such as a bonding wire provided along the long direction of the driving IC 110. A power source (VDD) of the driving IC, a ground signal (GND) of the driving IC, a control signal of the driving IC, and a driving signal such as a clock signal and a latch signal are inputted to the plurality of signal input pads 115 from the external wiring via the wiring pattern 120 and the input connection wiring 116. Note that FIG. 2 is a schematic view and the actual number of the terminals are different from that illustrated in FIG. 2.

In the embodiment described above, the wiring pattern 120 connected to the driving voltage supply pads 113 of the driving IC 110 is provided below the driving IC 110 along the long direction of the driving IC 110, and the driving voltage supply pads 113 on both ends provided in parallel and the wiring pattern 120 are connected by the connection wiring 114 provided along the long direction of the driving IC 110. Accordingly, unlike the conventional liquid-jet head, the wiring pattern 120 does not need to be provided outside the driving IC 110 in its short direction on the sealing plate 30, and the wiring pattern 120 and each of the driving voltage supply pads 113 do not need to be connected. Thus, a space forming the wiring pattern 120 on the sealing plate 30 can be reduced.

Similarly, by providing the signal input pads 115 in the end portion in the long direction of the driving IC 110, and by connecting the signal input pads 115 and the connection wiring 120 by use of the input connection wiring 116 provided along the long direction of the driving IC 110, a space forming the wiring pattern 120 on the sealing plate 30 can be reduced. Accordingly, the sealing plate 30 is made small-sized, and thus the head can be made small-sized.

The number j of the connection wirings 114 connecting the adjacent driving voltage supply pads 113 should preferably satisfy the following equation (1):

$$ncV/t < ij \qquad (1)$$

where c is electrostatic capacitance of one piezoelectric layer, n is the number of the piezoelectric elements 300 driven by one driving IC 110, V is the maximum voltage of the driving voltage, t is the minimum time constant of the driving voltage, and i is fusing current of one connection wiring 114.

Thus, even if a large number of piezoelectric elements 300 are simultaneously driven, the connection wiring 114 does not blow out, and the driving voltage is always supplied satisfactorily. In this embodiment, the electrostatic capacitance c of one piezoelectric layer 70 is 500 (pF), the number n of the piezoelectric elements 300 driving by one driving IC 110 is 180, the maximum voltage V of the driving voltage is 35 (V), the minimum time constant t of the driving voltage is 2 ($\mu$s), and the fusing current i of one connection wiring 114 is 1.5 (A). Therefore, the number j of the connection wirings 114 should be preferably larger than one, and the number j of the connection wirings 114 is two in this embodiment.

Furthermore, a compliance plate 40 composed of a sealing film 41 and a fixing plate 42 is joined to the sealing plate 30 on which the driving IC 110 is installed as described above. Herein, the sealing film 41 is made of a material having flexibility and low rigidity, for example, a polyphenylene sulfide (PPS) film having a thickness of 6 $\mu$m, and one side plane of the reservoir portion 32 is sealed by the sealing film 41. The fixing plate 42 is formed of a rigid material such as metal, for example, stainless steel. (SUS) having a thickness of 30 $\mu$m. Since a region in this fixing plate 42 facing the reservoir 100 is completely removed in the thickness direction of the fixing plate 42 to form an opening portion 43, one side plane of the reservoir 100 is sealed only by the sealing film 41 having flexibility.

An ink introducing port 44 for supplying ink to the reservoir 100 is formed in the compliance plate 40. Furthermore, an ink introducing passage 35 for allowing the ink introducing port 44 and a side wall of reservoir 100 to communicate with each other is provided in the sealing plate 30.

In such ink jet recording head in this embodiment, ink is taken in from the ink introducing port 44, which is connected to external ink supply means (not shown), via the ink introducing passage 35, and the inside portion of the ink jet recording head is filled with the ink from the reservoir 100 to the nozzle orifices 21. Thereafter, the driving voltage is applied between the respective lower and upper electrode films 60 and 80, which correspond to the pressure generating chambers 12, in response to the driving signal from the driving IC 110. The elastic film 50, the lower electrode film 60 and the piezoelectric layer 70 are deformed by deflection, whereby pressure in each pressure generating chamber 12 is increased, and the ink droplets are ejected from the nozzle orifices 21.

Embodiment 2

Figure 4:
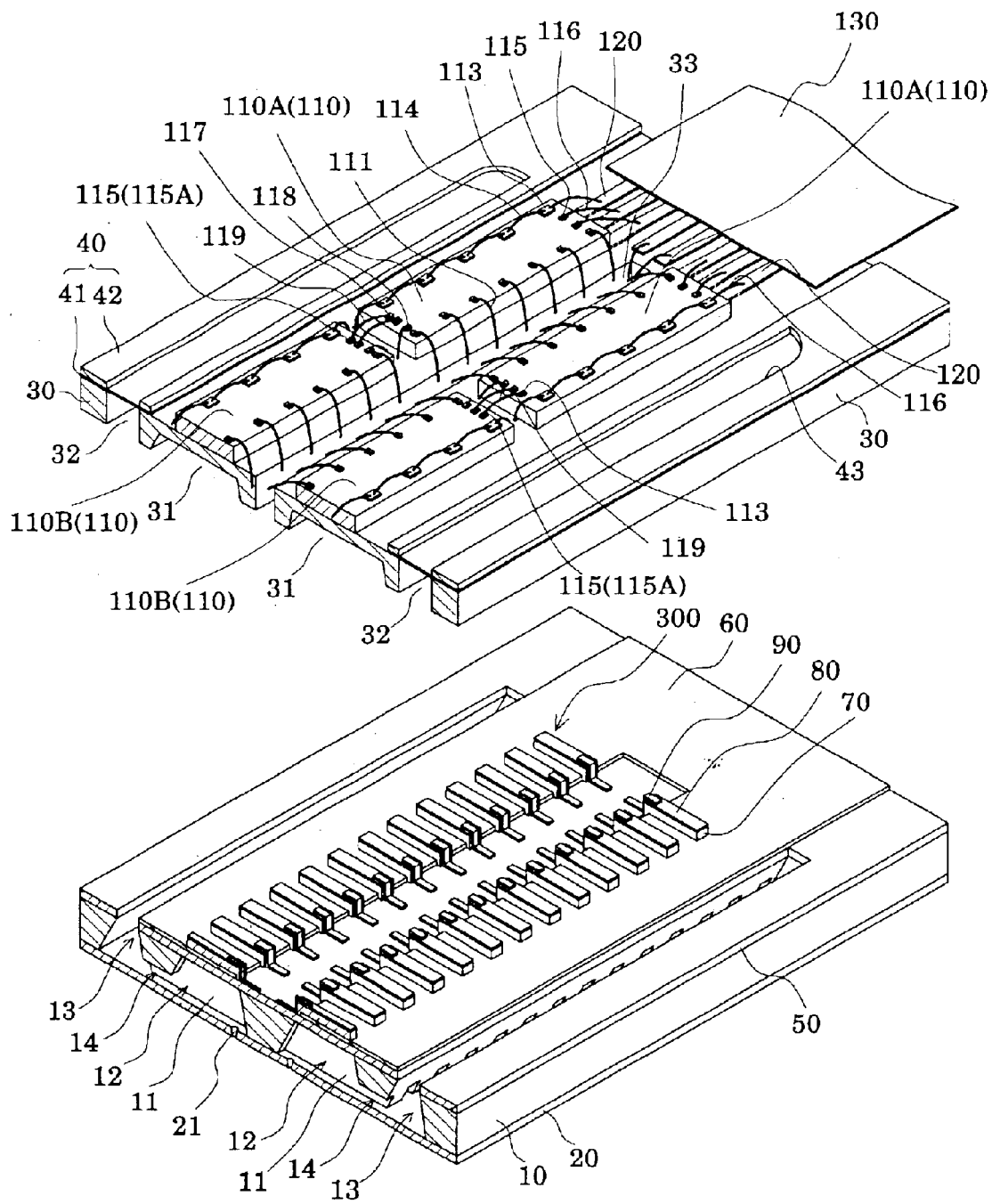
FIG. 4 is an exploded perspective view illustrating an outline of a recording head according to Embodiment 2.
Figure 5A:
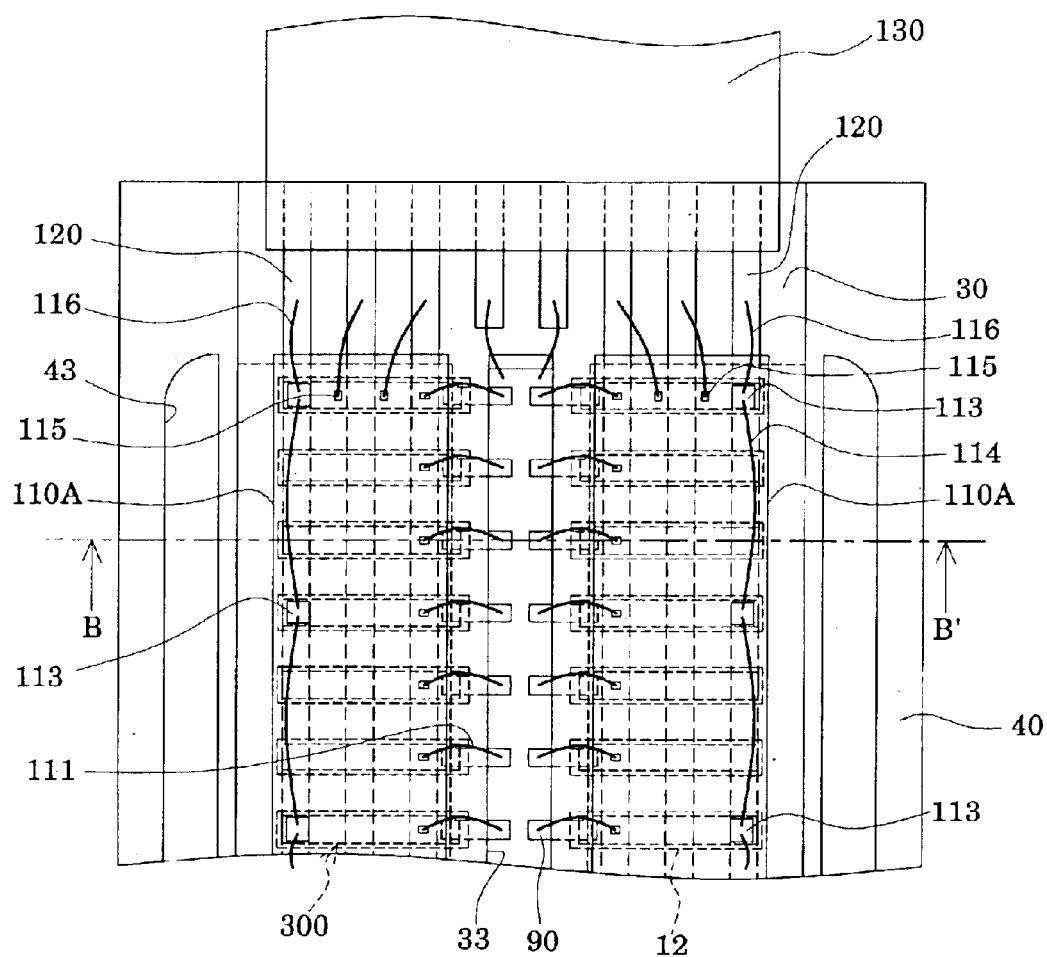
FIGS. 5(a) and 5(b) are, respectively, a plan view and a section view, which illustrates an outline of the recording head according to Embodiment 2.
Figure 5B:
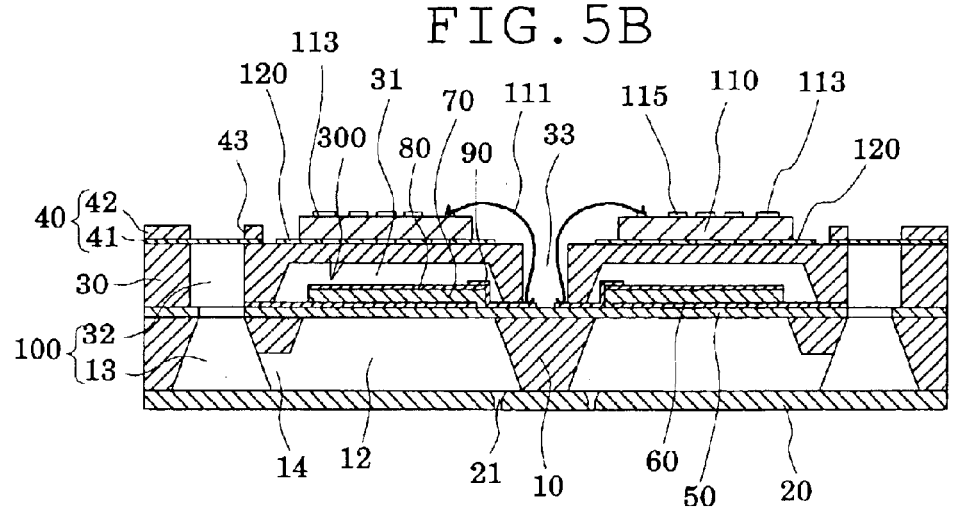
Figure 6:
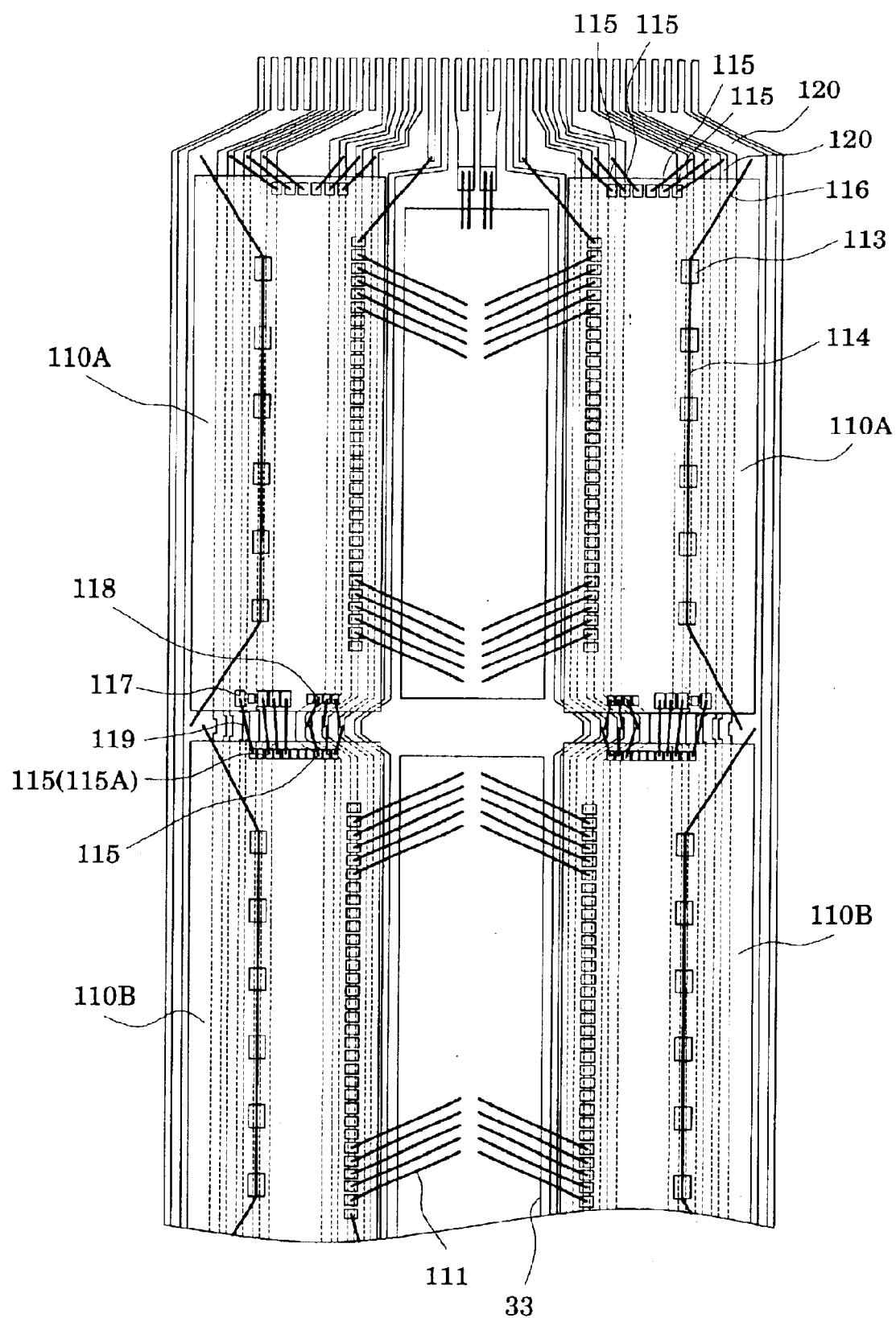
FIG. 6 is a plan view illustrating a connection state of a driving IC and a connection wiring according to Embodiment 2.
Figure 7:
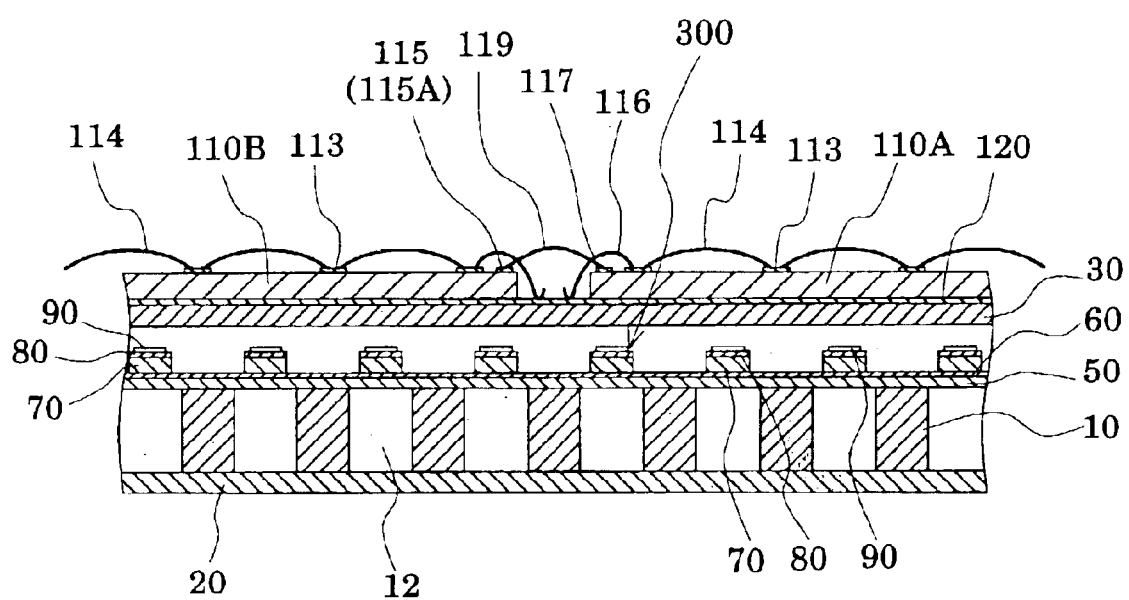
FIG. 7 is a section view schematically illustrating a principal portion of the recording head according to Embodiment 2.

This embodiment concerns another example of a wiring structure on the sealing plate, and is the same as Embodiment 1 except the wiring structure. Descriptions for the wiring structure of this embodiment will be made with reference to FIGS. 4 to 7 below. FIG. 4 is an exploded perspective view illustrating an outline of an ink jet recording head according to Embodiment 2, FIGS. 5(*a*) and 5(*b*) are, respectively, a schematic plan view of FIG. 4 and a section view of FIG. 4, FIG. 6 is a view illustrating a connection state of a driving IC and a connection wiring, and FIG. 7 is a section view schematically illustrating a principal part of the ink jet recording head.

As illustrated in the drawings, a plurality of driving ICs 110 (first driving IC 110A and second driving IC 110B) are provided in a region corresponding to the line of the pressure generating chambers 12 so as to be arranged along the direction where the pressure generating chambers 12 are provided in parallel. For example, in this embodiment, the first and second driving ICs 110A and 110B are fixed to the region of the sealing plate 30 facing the line of the pressure generating chambers 12 in the long directions of the first and second driving ICs 110A and 110B at predetermined intervals.

These driving ICs 110 are connected to the wiring pattern 120 provided on the sealing plate 30 by the input connection wiring 116 formed of the bonding wire, and the wiring pattern 120 is connected to an external wiring 130 such as FPC in the vicinity of the end portion of the sealing plate 30. The signal supplied from the external wiring 130 is supplied to the driving ICs 110 via the wiring pattern 120.

In more detail, the first and second driving ICs 110A and 110B are provided in parallel on the sealing plate 30 so as to extend from the external wiring 130 side along the long direction of the sealing plate 30. A plurality of the driving voltage supply pads 113, to which the driving voltage for driving the piezoelectric elements 300 is inputted, are intermittently provided on the first and second driving ICs 110A and 110B along the long directions thereof. Each driving voltage supply pad 113 is connected to the adjacent driving voltage supply pad 113 by the connection wiring 114 formed of a conductive wire such as a bonding wire. The driving voltage supply pads 113 which are located in parallel on both ends of each of the first and second driving ICs 110A and 110B, are connected to the wiring pattern 120 by the connection wiring 114. Accordingly, the driving voltage inputted from the external wiring 130 is supplied to the driving ICs 110A and 110B from both end portions in the long direction thereof via the wiring pattern 120 which is extensively provided along the long direction of each of the driving ICs 110.

In one end portion of each driving IC 110 in its long direction, that is, in the vicinity of the end portion on the external wiring 130 side in this embodiment, a plurality of the signal input pads 115, to which the driving signal that is mainly a signal of a control system is inputted, are provided. In the vicinity of the other end portion in the long direction of each driving IC 110, a plurality of signal output pads 117, from which parts of the driving signals inputted via the signal input pad 115 are outputted, are arranged. Input connection wirings 116 which are extensively provided from the wiring pattern 120 corresponding to the respective driving signals are respectively connected to the signal input pads 115 of the first driving IC 110A.

Furthermore, in this embodiment, signal input pads 118, to which parts of the driving signals are inputted, are also provided on the other end portion side in the long direction of the driving ICs 110, and the signal input pads 118 are connected to the wiring pattern 120 by the input connection wirings 116 at a gap portion between the first and second driving ICs 110A and 110B. Specifically, the predetermined driving signal is inputted from the end portion sides in the long direction of each driving IC 110.

On the other hand, similarly to the signal input pads 118 of the first driving IC 110A, the input connection wirings 116 provided so as to extend from the wiring pattern 120 at the gap portion between the first and second driving ICs 110A and 110B are connected to parts of the signal input pads 115 of the second driving IC 110B. However, coupling wirings 119 formed of a conductive wire such as a bonding wire, which are extensively provided from the signal output pads 117, are connected to the signal input pads 115 corresponding to the predetermined signal, for example, the signal input pads 115 (115A) corresponding to the signal output pads 117 provided in the first driving IC 110A. Specifically, parts of the driving signals are inputted to the second driving IC 110B via the first driving IC 110A.

Herein, the driving signal includes a power source signal for driving the driving IC, a ground signal, a serial signal, and various kinds of control system signal such as a clock signal and a latch signal. It is preferable that among the driving signals supplied to the first and second driving ICs 110A and 110B, driving signals apt to be influenced by a voltage drop, for example, a power source signal, a ground signal and the like, are supplied to each driving IC via the connection wiring 114. Therefore, in this embodiment, the signal input pads 115 corresponding to the power source signal (VDD), the ground signal (GND) and the like are provided on both sides in the long direction of the first and second driving ICs 110A and 110B.

On the other hand, since the clock signal, the latch signal and the like, which are the driving signals of the control system, are less influenced by the voltage drop, printing quality is not deteriorated, even if the driving signals are inputted to the second driving IC 110B via the first driving IC 110A, in other words, even if the predetermined signal output pad 117 of the first driving IC 110A and the signal input pad 115 of the second driving IC 110B are connected by the coupling wiring 119.

Therefore, in this embodiment, the latch signal (LAT), the clock signal (SCLK) and the like, which are the driving signals of the control system, are inputted to the signal input pads 115 (115A) of the second driving IC 110B from the signal output pads 117 of the first driving IC 110A via the coupling wirings 119. Since a less number of signal input pads 115 than the actual number thereof are illustrated in FIG. 6, the actual number of the signal input pads 115 is different from that illustrated in FIG. 6.

Although the serial signal may be also supplied to the second IC 110B via the first driving IC 110A, the clock signal needs to be made high in level. Since a higher frequency than necessary leads to an increase in cost because of EMC countermeasures, this is not preferable.

As described above, in this embodiment, at least two driving ICs are provided in parallel on the sealing plate, and the signal output pads of one driving IC and the signal input pads of the other driving IC are directly connected. Parts of the driving signals are inputted to one driving IC via the other driving IC. Accordingly, a space for extending the input connection wiring from the wiring pattern can be minimized, so that it is possible to make a small-sized head relatively easily. Furthermore, by providing the plurality of driving ICs in parallel, it is possible to realize an actually long driving IC. Therefore, it is possible to greatly increase the number of the nozzle orifices per one line. For example, an ink jet recording head, in which the number of the nozzle orifices is set to about 360 per one line, can be realized relatively easily, thus controlling a significant increase in cost.

Moreover, similarly to Embodiment 1, in this embodiment, the signal input pads 115 and 118 are provided in the vicinity of the end portion in the long direction of the first and second driving ICs 110A and 110B, and the input connection wiring 116 is provided extensively in the long direction thereof. In other words, the input connection wiring 116 is connected to the wiring pattern 120 inside the width of the driving IC 110. Thus, it is unnecessary to secure a space for leading out the input connection wiring 116 outside the driving ICs 110 in the width direction thereof, and the width of the head can be significantly reduced. Specifically, the sealing plate 30 can be made small-sized, and the small size of the head can be achieved.

Other Embodiments

The embodiments of the present invention have been described above. However, the present invention is not limited to the foregoing embodiments.

For example, in the foregoing embodiments, the output pad 112 of the driving IC 110 and the lead electrode 90 extensively provided from the upper electrode film 80 of the piezoelectric element 300 are connected via the output connection wiring 111 formed of a conductive wire. The connection structure is not limited to the above. For example, a structure may be employed, in which a conductive film is formed on the surface of the sealing plate 30, and the output pad 112 of the driving IC 110 and the lead electrode 90 are connected via the conductive film.

For example, in the foregoing embodiments, although the driving voltage for driving the piezoelectric element 300 is inputted from the both end portion sides in the long direction of each driving IC 110, as a matter of course, this driving voltage maybe inputted from only one end portion side in the long direction thereof.

For example, in Embodiment 2 described above, the two driving ICs 110A and 110B are provided in parallel in the regions corresponding to the line of the pressure generating chambers. Needless to say, three or more driving ICs may be provided in parallel.

Moreover, for example, in the descriptions for the foregoing embodiments, the thin film type ink jet recording head manufactured by use of a film formation method and a lithography method has been used as an example. However, as a matter of course, the embodiment of the present invention is not limited to this. The present invention can be adopted for a thick film type ink jet recording head manufactured by a method in which a green sheet is adhered.

Figure 8:
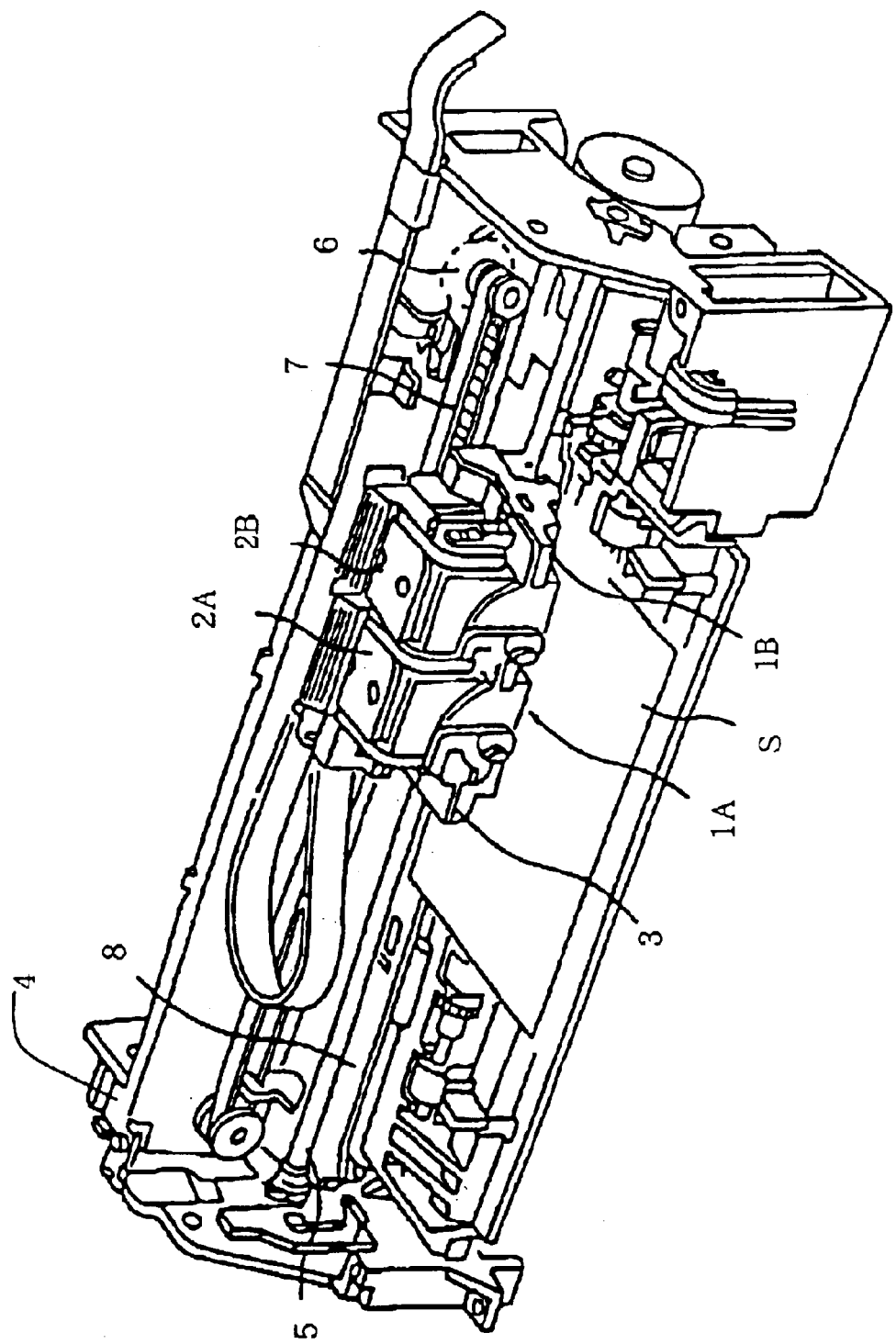
FIG. 8 is a schematic view of a recording apparatus according to an embodiment of the present invention.

The ink jet recording head of the embodiments constitutes a part of a recording head unit comprising an ink flow path communicating with an ink cartridge and the like, and is installed in an ink jet recording apparatus. FIG. 8 is a schematic view illustrating an example of the ink jet recording apparatus.

As illustrated in FIG. 8, in recording head units 1A and 1B, each having an ink jet recording head, cartridges 2A and 2B constituting ink supply means are provided detachably, and a carriage 3 loading the recording head units 1A and 1B is provided to a carriage shaft 5, which is fitted to a body 4 of the apparatus, movably in an axis direction of the carriage shaft 5. The recording head units 1A and 1B ejects, for example, black ink compound and color ink compound, respectively.

The driving force of a driving motor 6 is transmitted to the carriage 3 via a plurality of gears (not shown) and a timing belt 7, whereby the carriage 3 loading the recording head units 1A and 1B is moved along the carriage shaft 5. Meanwhile, a platen 8 is provided in the body 4 of the apparatus along the carriage shaft 5, and a recording sheet S, which is a recording medium such as paper fed by a paper feeding roller (not shown) and the like, is transported on the platen 8.

In the foregoing embodiments, for an example of the liquid-jet head, the ink jet recording head, which prints a predetermined image and characters onto a printing medium, has been described. As a matter of course, the present invention is not limited to this, and the present invention is intended for all of the liquid-jet heads. As the liquid-jet head, for example, a coloring material ejection head used for manufacturing a color filter of a liquid crystal display and the like, an electrode material head used for forming an electrode of an organic EL display, a FED (face emission display) and the like, and a living organic matter ejection head used for manufacturing a bio-chip can be listed.

What is claimed is:

1. A liquid-jet head comprising:
   a passage-forming substrate in which pressure generating chambers communicating with nozzle orifices are defined, and
   piezoelectric elements; each piezoelectric element being provided in the passage-forming substrate via a vibration plate,
   wherein a joint plate, on which driving ICs and a wiring pattern are provided, to an upper portion of which is connected an external wiring, is joined to the piezoelectric element side of the passage-forming substrate, a plurality of driving voltage supply pads, to which a driving voltage to be distributed to each piezoelectric element is supplied, are provided on the driving IC along a long direction of the driving IC, the adjacent driving voltage supply pads being electrically connected by a connection wiring formed of a conductive wire, and the driving voltage supply pad in an end portion of the driving IC in the long direction thereof and the wiring pattern being electrically connected by the connection wiring.

2. The liquid-jet head according to claim 1, wherein the wiring pattern is formed on outside of the both end portions of the driving IC in the long direction thereof, the driving voltage supply pads on both ends provided in parallel and the wiring pattern is electrically connected via the connection wiring, and the external wiring is connected to the wiring pattern in the vicinity of the end portion of the driving IC on the joint plate in the long direction of the driving IC.

3. The liquid-jet head according to claim 1, wherein the number j of the connection wirings connected to the driving voltage supply pad satisfies the following equation (1):

$$ncV/t < ij \qquad (1)$$

where c is electrostatic capacitance of one piezoelectric element, n is the number of the piezoelectric elements driven by one driving IC, V is the maximum voltage of the driving voltage, t is the minimum time constant of the driving voltage, and i is a fusing current of one connection wiring.

4. The liquid-jet head according to claim 1, wherein a plurality of signal input pads, to which a driving signal for driving the driving IC is inputted, are provided in the end portion of the driving IC in the long direction thereof.

5. The liquid-jet head according to claim 1, wherein the pressure generating chambers defined in parallel by a plurality of compartment walls are provided in two lines, and the two driving ICs are provided to correspond to the lines of the pressure generating chambers.

6. The liquid-jet head according to claim 1, wherein the pressure generating chambers are formed by anisotropically etching a single crystal silicon substrate, and each layer of the piezoelectric element is formed by a film formation method and a lithography method.

7. A liquid-jet head comprising:

a passage-forming substrate in which pressure generating chambers communicating with nozzle orifices are defined; and piezoelectric elements including a lower electrode, a piezoelectric layer and an upper electrode, which are provided in the passage-forming substrate via a vibration plate, wherein a joint plate connected to the piezoelectric element side of the passage-forming substrate is provided; a wiring pattern, to which an external wiring is connected, is provided on the joint plate; at least two driving ICs for driving the piezoelectric elements are loaded on the joint plate at predetermined intervals in a direction where the pressure generating chambers are provided in parallel; a driving voltage supply pad, to which a driving voltage to be distributed to the piezoelectric elements is supplied, is provided on the driving ICs; signal input pads connected to connection wirings extensively provided from the wiring pattern are provided in the driving IC; signal output pads, from which part of the driving signal inputted thereto is outputted, are provided in the driving IC; and the signal output pads of one driving IC adjacent to the other driving IC and the signal input pads of the other driving IC are connected by a coupling wiring.

8. The liquid-jet head according to claim 7, wherein the driving ICs are provided in parallel at predetermined intervals along the long direction thereof, the signal input pads are arranged in the vicinity of one end portion of the driving IC in the long direction thereof, and the signal output pads are arranged in the vicinity of the other end portion of the driving IC in the long direction thereof.

9. The liquid-jet head according to claim 8, wherein signal input pads corresponding to at least a part of driving signals except a signal outputted via the signal output pads are further provided.

10. The liquid-jet head according to claim 7, wherein the connection wirings are connected to the wiring pattern inside a width of the driving IC.

11. The liquid-jet head according to claim 7, wherein the driving IC is a serial parallel conversion type driver IC, and the driving signal outputted via the signal output pads includes at least a clock signal and a latch signal.

12. The liquid-jet head according to claims 7, wherein the driving signal inputted from the signal input pads via the connection wiring includes at least a ground signal and a power source signal for driving.

13. The liquid-jet head according to claim 7, wherein the pressure generating chambers are formed by anisotropically etching a single crystal silicon substrate, and each layer of the piezoelectric element is formed by a film formation method and a lithography method.

14. A Liquid-jet apparatus, comprising:

the liquid-jet head according to any one of claims 1 to 13.

* * * * *